(12) United States Patent
Park (10) Patent No.: US 7,446,586 B2
(45) Date of Patent: *Nov. 4, 2008

(54) PULSE GENERATOR

(75) Inventor: Nak Kyu Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/687,068

(22) Filed: Mar. 16, 2007

(65) Prior Publication Data

US 2007/0152728 A1 Jul. 5, 2007

Related U.S. Application Data

(62) Division of application No. 10/878,142, filed on Jun. 28, 2004, now Pat. No. 7,205,814.

(30) Foreign Application Priority Data

Apr. 22, 2004 (KR) ............................... 2004-27889

(51) Int. Cl.
*H03K 3/00* (2006.01)

(52) U.S. Cl. ...................................... 327/291; 327/299

(58) Field of Classification Search .................. 327/50, 327/63, 77, 90, 99, 291, 293, 294, 299
See application file for complete search history.

(56) References Cited

U.S. PATENT DOCUMENTS

| 4,785,262 | A | * | 11/1988 | Ryu et al. ................... 331/111 |
| 5,416,445 | A | * | 5/1995 | Narahara ...................... 331/49 |
| 5,638,028 | A | * | 6/1997 | Voth ............................ 331/25 |
| 5,642,068 | A | * | 6/1997 | Wojcicki et al. ............. 327/172 |
| 5,652,536 | A | * | 7/1997 | Nookala et al. ............. 327/298 |
| 5,751,175 | A | * | 5/1998 | Imamura ..................... 327/291 |
| 6,278,638 | B1 | * | 8/2001 | Tomita et al. .......... 365/189.07 |
| 6,346,823 | B1 | * | 2/2002 | Kim ............................. 326/29 |
| 7,205,814 | B2 | * | 4/2007 | Park ........................... 327/291 |

* cited by examiner

*Primary Examiner*—Lincoln Donovan
*Assistant Examiner*—Hai L. Nguyen
(74) *Attorney, Agent, or Firm*—Ladas & Parry LLP (57) ABSTRACT

The disclosure is directed to an internal pulse generator outputting a signal with a constant pulse width nevertheless of a frequency of an input signal, including a first PMOS transistor, a PMOS second transistor and an NMOS transistor which are connected between a power supply voltage and a ground voltage in series, a latch and an inverter which are connected between an output terminal and a first node as a drain of the NMOS transistor, and a Y-time delay circuit connected between the output terminal and a second node that is a common gate of the PMOS and NMOS transistors.

2 Claims, 14 Drawing Sheets

| 100mhz(Async) | Internal clock |
|---|---|
| slow | 2.66n |
| typ | 1.76n |
| fast | 1.3n |

| 330mhz(Async) | Internal clock |
|---|---|
| slow | 2.68n |
| typ | 2.24n |
| fast | 2.1n |

| 700mhz(Async) | Internal clock |
|---|---|
| slow | 1.9n |
| typ | 1.46n |
| fast | 1.32n |

100mhz(Async)

|  | Internal clock |
|---|---|
| slow | 1.9n |
| typ | 1.46n |
| fast | 1.32n |

330mhz(Async)

|  | Internal clock |
|---|---|
| slow | 1.9n |
| typ | 1.46n |
| fast | 1.32n |

700mhz(Async)

|  | Internal clock |
|---|---|
| slow | 1.9n |
| typ | 1.46n |
| fast | 1.32n |

PULSE GENERATOR

This application is a divisional application of U.S. application Ser. No. 10/878,142, now issued as U.S. Pat. No. 7,205,814.

BACKGROUND OF THE INVENTION

1. Field of the Invention

The present invention relates to an internal pulse generator outputting a signal with a constant pulse width nevertheless of a frequency of an input signal.

2. Description of the Related Art

In general, a synchronous semiconductor device is operable in sync with an external clock signal outputted from a controller of the semiconductor device. Such an operation is also applied to a synchronous memory device. That is, a synchronous memory device is operable in sync with an external clock signal output from a memory controller. In operation, it is usual that a memory device receiving an external clock signal generates an internal clock signal in addition, which is necessary to conduct internal operations.

Figure 1A:
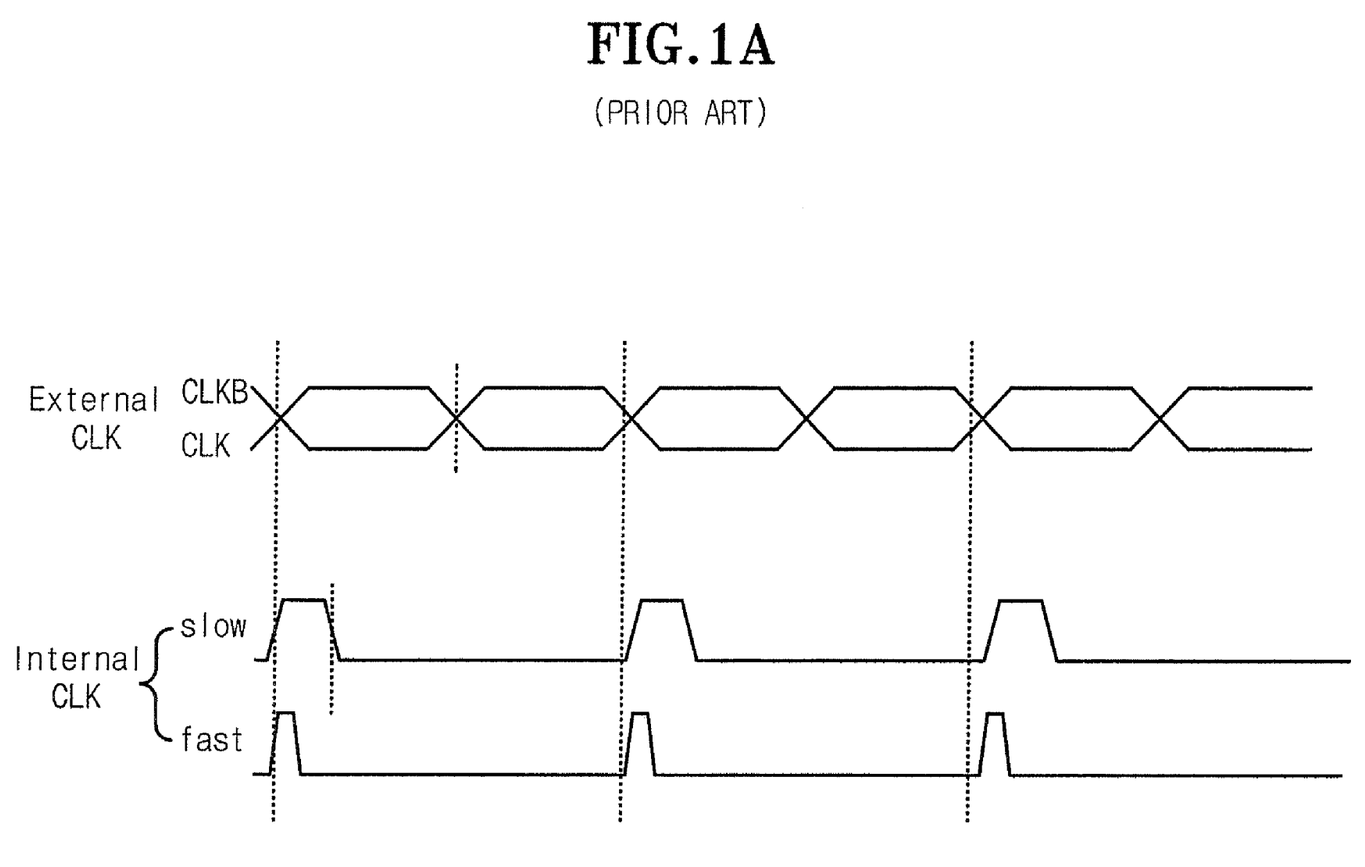
FIG. 1A is a diagram illustrating a way of generating an internal clock signal when a frequency of an external clock signal is low.

FIG. 1A illustrates an external clock signal with a frequency of 100 MHZ outputted from a memory controller and an internal clock signal generated in a memory device. In FIG. 1A, the reference character CLK denotes the external clock signal and CLKB denotes a signal reverse to the CLK in phase. As illustrated in FIG. 1A, the memory device receiving the external clock signal CLK generates the internal clock signal that is used to conduct internal operations.

A general reason for additionally generating an internal clock signal used in a memory device is as follows.

In FIG. 1A, as a cycle period of the external clock signal of 100 MHz is 10 ns, a half of the cycle period is 5 ns. Assuming that the external clock signal is directly used in the memory device with buffering, when the external clock signal is applied to a gate of a transistor so as to enable the transistor to be active, the transistor will be maintained its active state during 5 ns. But, in practical, there are few times of retaining a transistor on an active state for 5 ns in internal operations. Thus, it would be inevitable to result in undesirable power consumption.

Further, if the external clock signal has a low frequency, an internal pulse with a narrow width, that is modified from the external clock signal, can be useful to carry out a plurality of operations in a cycle of the external clock signal.

By those reasons, the memory device needs to use an internal clock signal specifically generated to be enabled only for necessary times in active operations. In reference, it is typical for a memory device to employ a pulse generator in order to generate an internal clock signal.

Meantime, it is usual that pulse widths of a pulse signal (i.e., an internal clock signal) outputted from a pulse generator are irregular, which is denoted into "slow" signal and "fast" signal in FIG. 1A. Typically, a pulse width is minimized under a fast condition, while becomes twice of the fast condition under a slow condition. Such an irregular pulse width arises from variation of operational characteristic in a pulse generator in accordance with variations of processing conditions, pressures, temperature, and so on.

Figure 1B:
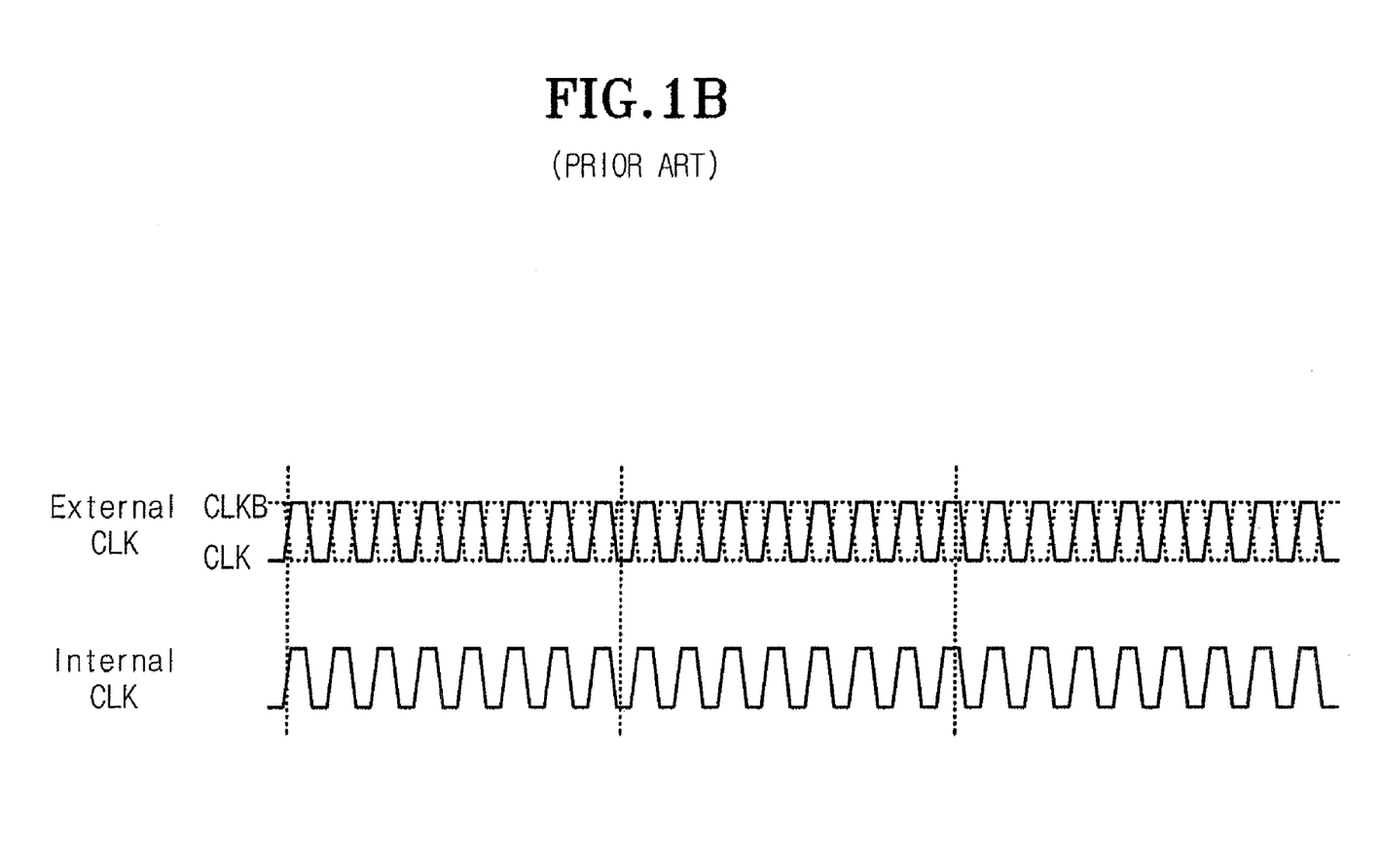
FIG. 1B is a diagram illustrating a way of generating an internal clock signal when a frequency of an external clock signal is high.

In addition, as illustrated in FIG. 1B, if a frequency of the external clock signal goes over a definite level, it becomes very difficult to properly generate an internal clock signal by mean of the pulse generator.

For instance, when the frequency of the external clock signal is about 700 MHz as shown in FIG. 1B, a cycle time of the external clock signal is about 1.4 ns and its half cycle time is 0.715 ns. Here, such a short cycle time is most unavailable to be used in generating an internal clock signal as a pulse signal by a pulse generator.

As an example, it will be considered about the case of generating an internal clock signal with a frequency of 700 MHz by means of the pulse generator.

As aforementioned, the pulse generator has an output signal variable with its pulse width due to processing parameters. Therefore, when a high level period of the pulse signal is set on 0.715 ns under the fast condition, a high level period of the pulse signal under the slow condition will be about 1.4 ns because it is two times of the fast condition. As a result, since there is no low level period of the pulse signal in fact, it is impossible for the pulse signal to function its normal operation. To the contrary, when the pulse signal is set on 0.715 ns under the slow condition, a high level period of the pulse signal will become 0.3 ns under the fast condition. However, as the pulse signal with the high level period of 0.3 ns is near a glitch signal in substance, it is also impossible for the pulse signal to be operable normally.

Figure 2:
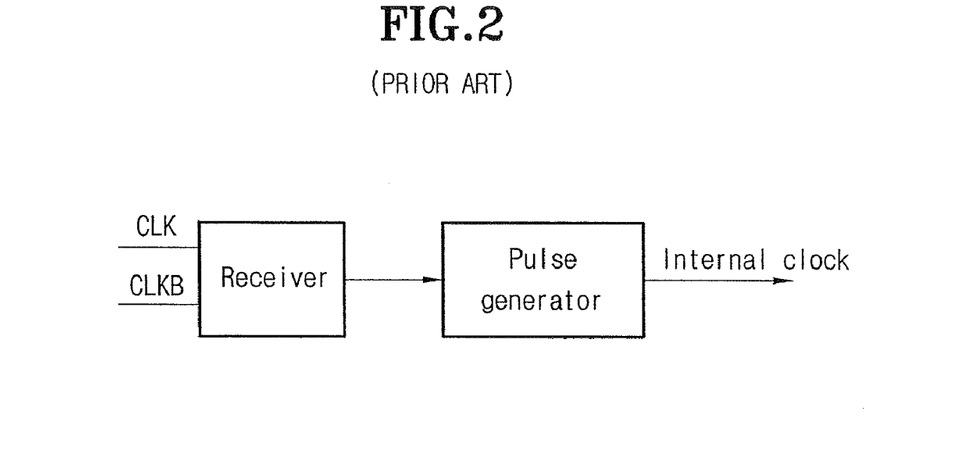
FIG. 2 illustrates an example of a conventional pulse generator for outputting an internal clock signal from receiving the external clock signals CLK and CLKB.

FIG. 2 illustrates an example of a conventional pulse generator for outputting an internal clock signal from receiving the external clock signals CLK and CLKB. Exemplary signal waveforms of FIG. 2 are shown in FIG. 1A.

In FIG. 2, the pulse generator receives an output signal from a receiver having a buffering function and outputs an internal pulse signal with a predetermined pulse width. Such a circuit for generating an internal pulse signal necessary to internal operations by employing the pulse generator is called as a pulse base device. On the other side, a circuit using an external clock signal as internal clock signal directly is referred to as a clock base device. The clock base device is used when a frequency of an external clock signal is very high, which will be described later.

Figure 3:
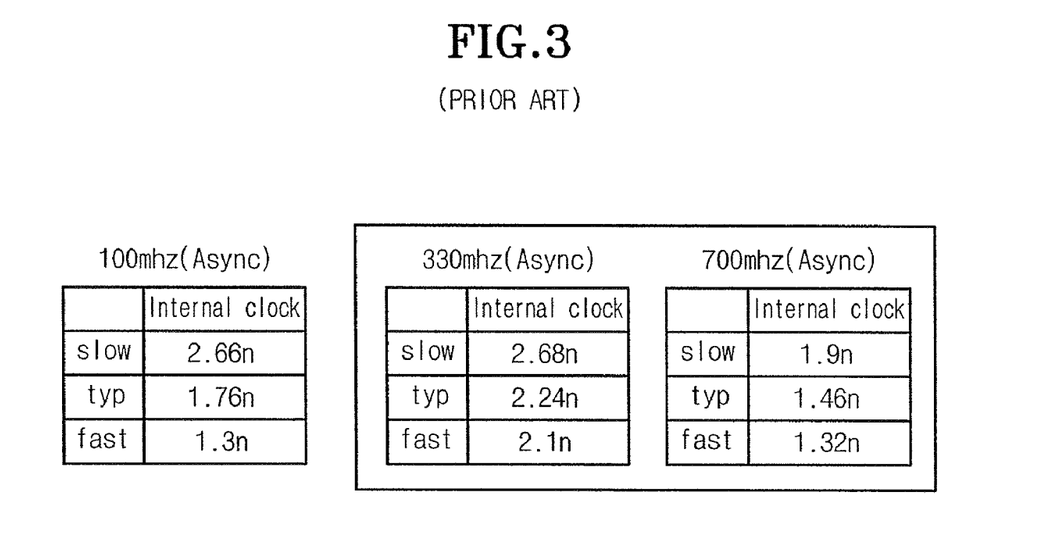
FIG. 3 illustrates active periods (high level periods) of an internal clock signal when a frequency of an external clock signal is 100 MHz, 300 MHz, and 700 MHz, respectively.

FIG. 3 illustrates active periods (high level periods) of an internal clock signal when a frequency of an external clock signal is 100 MHz, 300 MHz, and 700 MHz, respectively. Slow, typ, and fast conditions illustrate characteristic differences for the devices in accordance with variations of processing parameters. Those conditions differentiate the pulse width of the internal clock signal.

In FIG. 3, when a frequency of the external clock signal is 100 MHz, a pulse generator is used to generate the internal clock signal. When a frequency of the external clock signal is 300 MHz or 700 MHz, pulse widths of pulse signals under the clock base device without the pulse generator are used.

As illustrated in FIG. 3, the conventional cases have irregular pulse widths, large differences between them as well. It is desirable to make pulse widths of an internal clock signal be uniform in order to accomplish a stable internal operation of a memory device. In other words, pulse widths of the internal clock signal used in a memory device need to be uniform, even when a frequency of external clock signal varies.

However, as illustrated in FIG. 3, the conventional case shows that pulse widths of the internal clock signal are variable in accordance with variation of a frequency of the external clock signal. Moreover, it can be seen that the differences between pulse widths are large in accordance with variations of processing parameters.

Figure 4A:
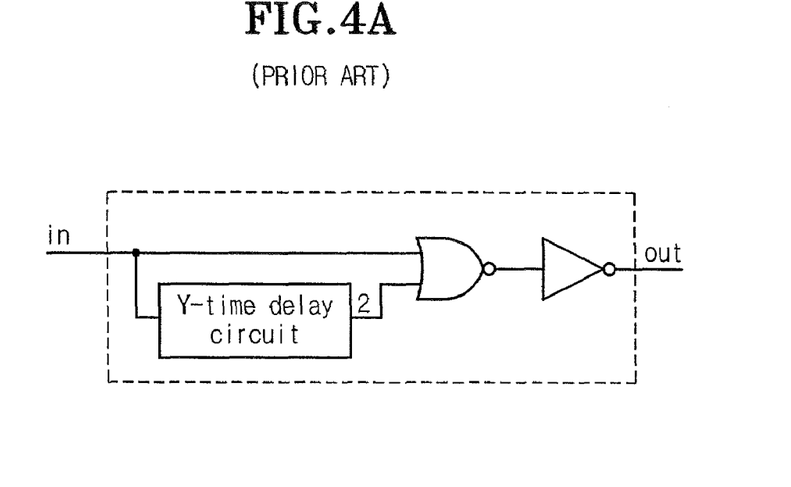
FIGS. 4A and 4B illustrate examples of conventional pulse generators.
Figure 4B:
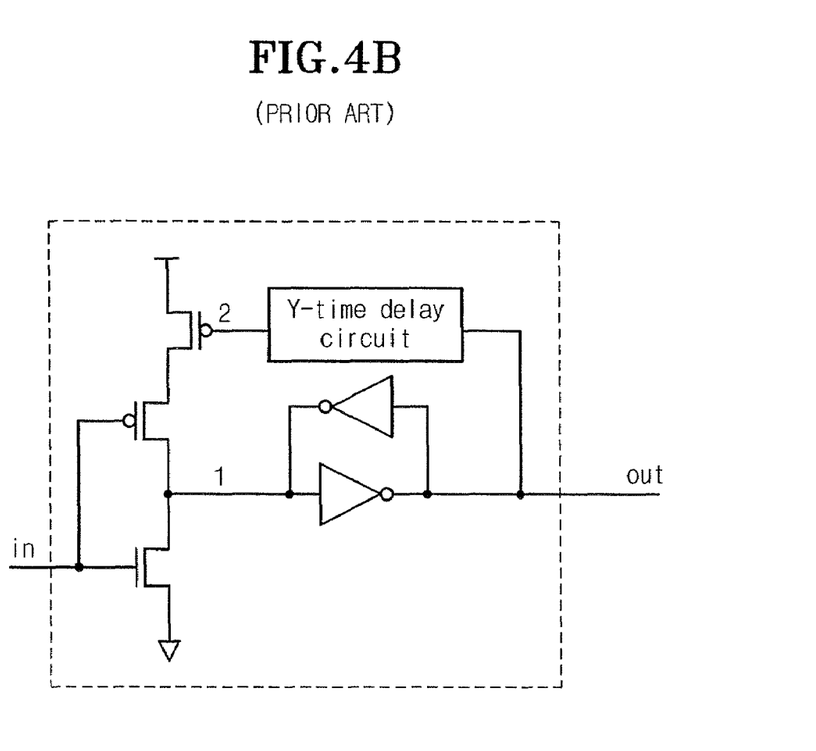

FIGS. 4A and 4B illustrate examples of conventional pulse generators.

In FIGS. 4A an 4B, an input signal IN generally corresponds to a signal passing through the receiver shown in FIG. 2, while an output signal OUT corresponds to an output signal of the pulse generator shown in FIG. 2. Accordingly, the output signal OUT corresponds to the internal clock signal.

In FIGS. 4A and 4B, a Y-time delay circuit outputs a signal applied thereto with delaying by a Y-time.

Figure 4C:
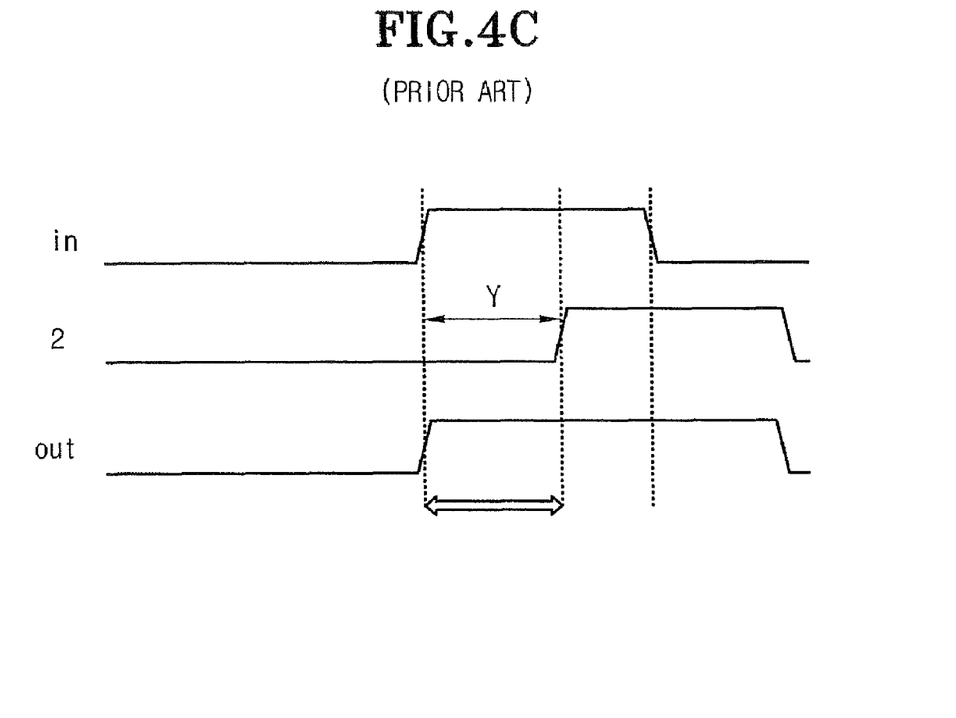
FIG. 4C is a waveform diagram when an input signal (in) has a wide pulse width.
Figure 4D:
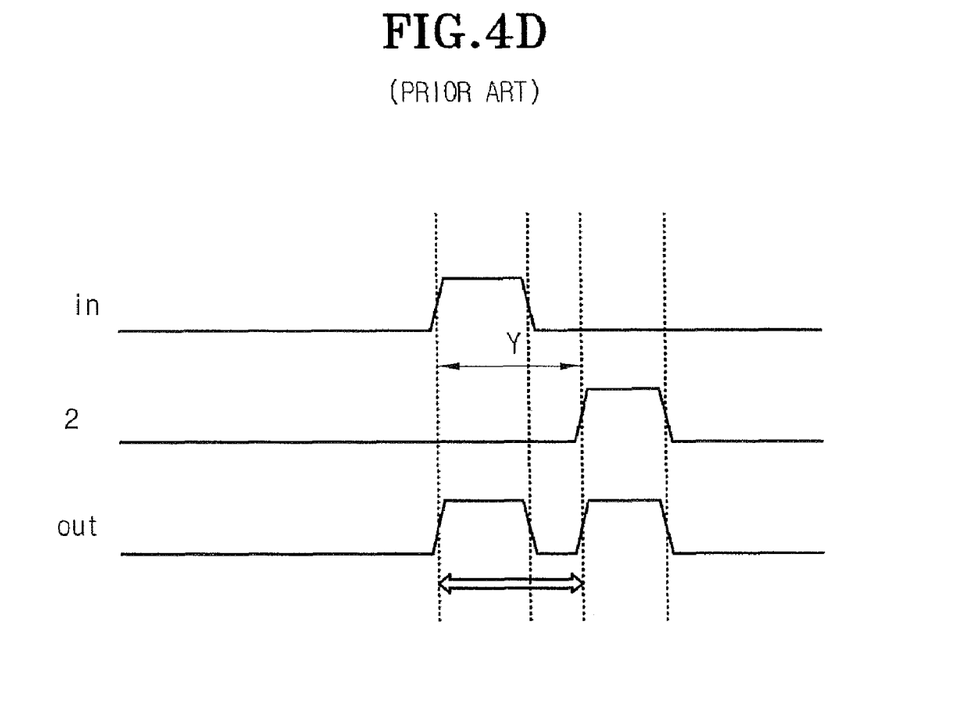
FIG. 4D is a waveform diagram when an input signal (in) has a short pulse width.

FIG. 4C is a waveform diagram when the input signal IN has a wide pulse width and FIG. 4D is a waveform diagram when the input signal IN has a short pulse width.

As can be seen from FIGS. 4C and 4D, when a frequency of an input signal applied thereto in FIGS. 4A and 4B is low (i.e., a pulse width of the input signal is wide), a designer can obtain a desired output waveform (FIG. 4C). Otherwise, when a frequency of the input signal is high (i.e., a pulse width of the input signal is narrow), it is impossible to obtain an output waveform desired by a designer.

Figure 5A:
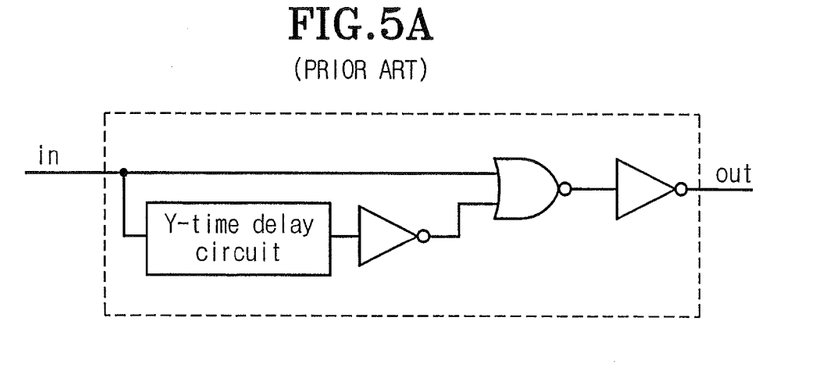
FIG. 5A illustrates another example of a conventional pulse generator.
Figure 5B:
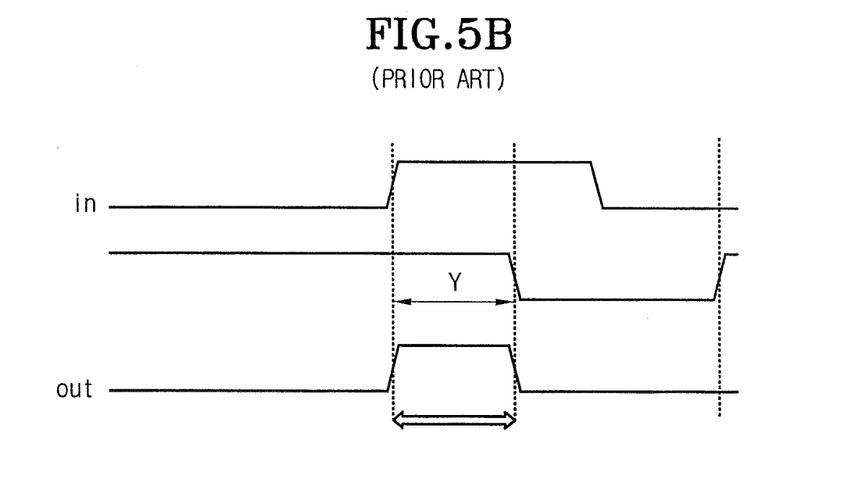
FIGS. 5B and 5C are output waveform diagrams in accordance with a frequency of an input signal applied to the pulse generator shown in FIG. 5A.
Figure 5C:
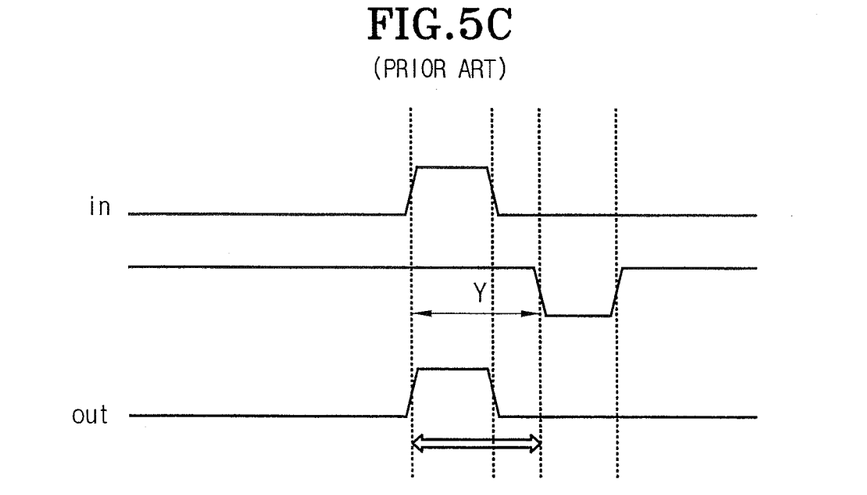

FIG. 5A illustrates another example of a conventional pulse generator, and FIGS. 5B and 5C are output waveform diagrams in accordance with a frequency of an input signal.

As illustrated, the case of FIG. 5A enables a designer to obtain a desired output waveform when a frequency of the input signal applied to the circuit of FIG. 5A is low (FIG. 5B). But, when a frequency of the input signal applied to the circuit of FIG. 5A is high, it is impossible to obtain an output waveform desired by a designer as shown in FIG. 5C.

Figure 6A:
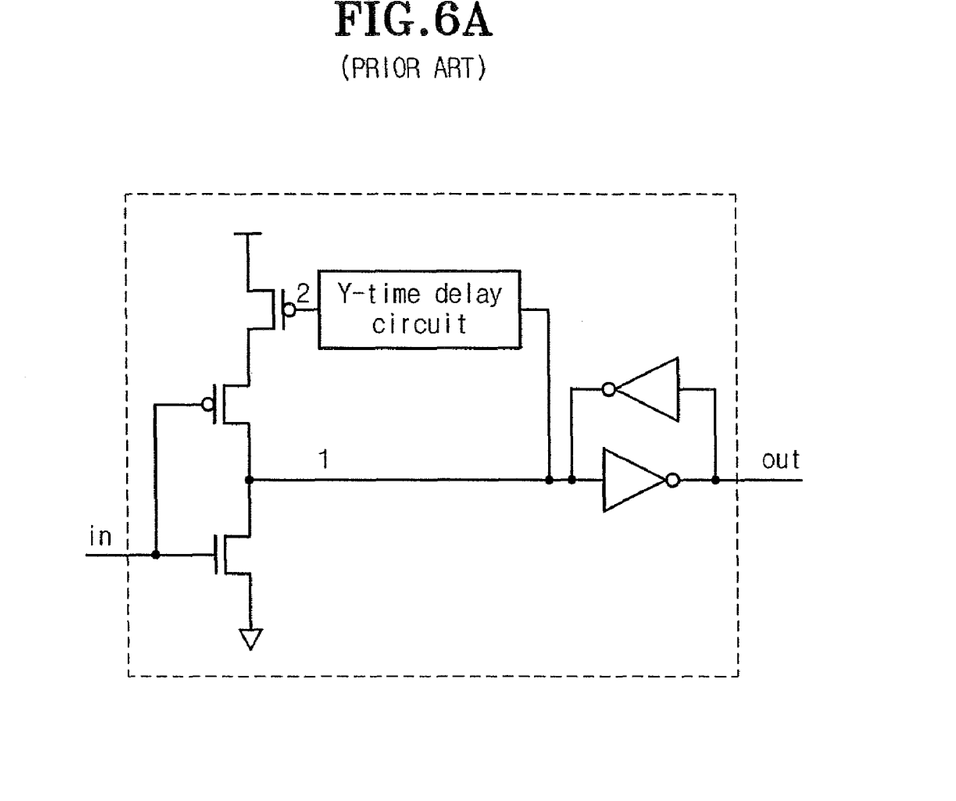
FIG. 6A illustrates further another example of a conventional pulse generator.
Figure 6B:
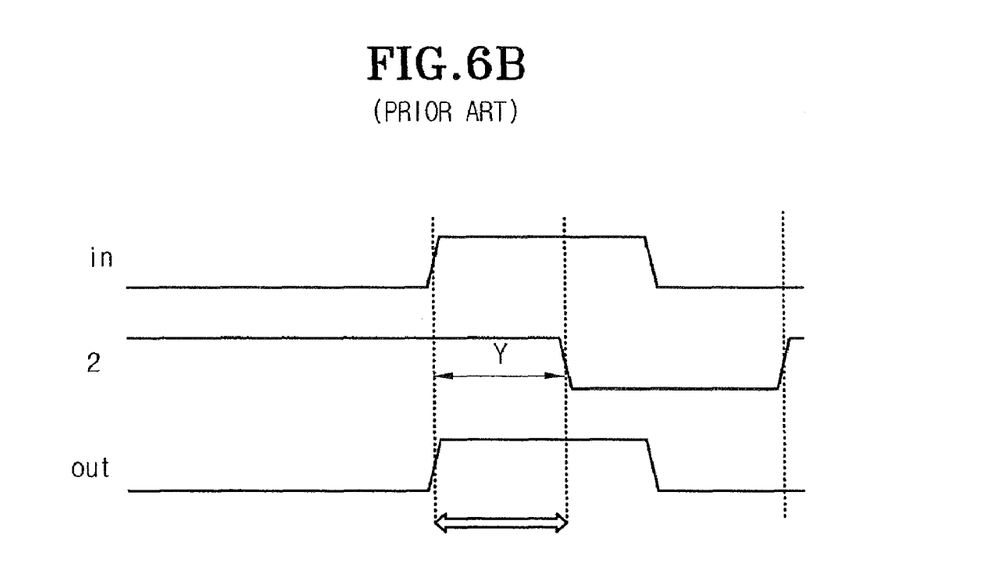
FIGS. 6B and 6C are output waveform diagram in accordance with a frequency of an input signal applied to the pulse generator shown in FIG. 6A.
Figure 6C:
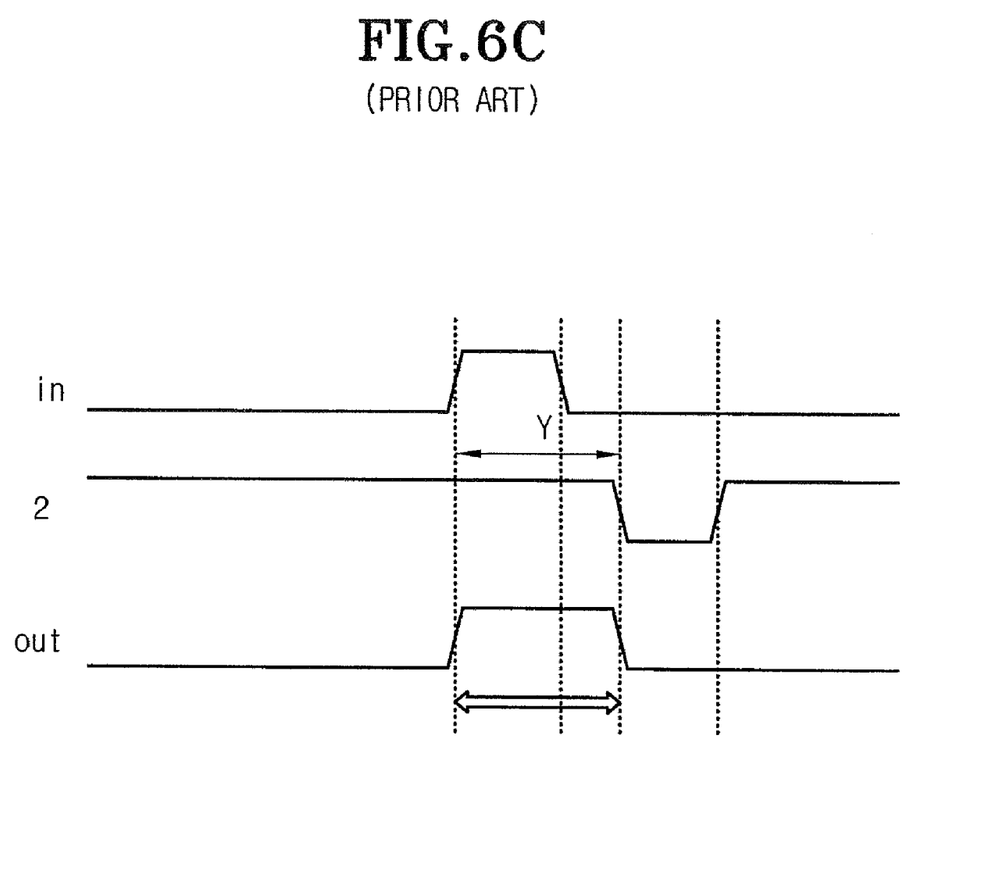

FIG. 6A illustrates further another example of a conventional pulse generator. FIGS. 6B and 6C are output waveform diagrams in accordance with a frequency of an input signal.

As illustrated, the case of FIG. 6A enables a designer to obtain a desired output waveform when a frequency of the input signal applied to the circuit of FIG. 6A is high (FIG. 6C). But, when a frequency of the input signal applied to the circuit of FIG. 6A is low, it is impossible to obtain an output waveform desired by a designer as shown in FIG. 6B.

From considering the above, it is very difficult for the conventional cases to obtain an internal pulse signal (i.e., an internal clock signal) having a stable pulse width desired by a designer when a frequency of an input signal (i.e., an external clock signal) varies.

SUMMARY OF THE INVENTION

Accordingly, the present invention has been made in an effort to solve the problems occurring in the related art, and an object of the present invention is to provide an apparatus for generating an internal pulse signal by means of a pulse generator when a frequency of an external clock signal is high, while uses the external clock signal as an internal clock signal directly when a frequency of the external clock signal is high.

Another object of the present invention is to provide a pulse generator for outputting an internal clock signal having a stable pulse width nevertheless of variation in a frequency of a signal applied to the pulse generator.

In order to achieve the above object, according to one aspect of the present invention, there is provided a pulse generator comprising: a first driving unit turned on/off by an input signal; a latch for holding a first power supply voltage to be transferred through the first driving unit; a driver for generating a clock pulse in response to an output signal of the latch; a delay circuit for delaying an output signal of the driver by a predetermined time; and a second driving unit turned on/off by an output signal of the delay circuit; wherein the latch holds a second power supply voltage when the second driving unit is turned on and a pulse width of the output signal of the driver is uniform regardless of a frequency of the input signal.

In the first embodiment, the first power supply voltage is a ground voltage and the second power supply voltage is a high level driving voltage.

In the first embodiment, the delay time of the delay circuit is adjustable.

In the first embodiment, the first driving unit includes first and second NMOS transistors serially connected between a first node and the second power supply voltage; wherein the second driving unit is a PMOS transistor between the first power supply voltage and the first node; wherein the latch is interposed between the first and second nodes; wherein the second node is connected to an input terminal of the driver; wherein an output signal of the delay circuit is applied to gates of the first NMOS transistor and the PMOS transistor; and wherein the input signal is applied to a gate of the second NMOS transistor.

A second embodiment of the present invention provides a pulse generator comprising: a first driving unit turned on/off by an input signal; a latch for holding a first power supply voltage to be transferred through the first driving unit; a driver for generating a pulse signal in response to an output signal of the latch; a delay circuit for delaying an output signal of the driver by a predetermined time; and a second driving unit turned on/off by an output signal of the delay circuit; wherein the latch holds a second power supply voltage when the second driving unit is turned on and a pulse width of the output signal of the driver is uniform regardless of a frequency of the input signal.

In the second embodiment, the first power supply voltage is a ground voltage and the second power supply voltage is a high level driving voltage.

In the second embodiment, the first driving unit includes first and second PMOS transistors serially connected between a first node and the first power supply voltage; wherein the second driving unit is an NMOS transistor between the first node and the second power supply voltage; wherein the latch is interposed between the first and second nodes; wherein the second node is connected to an input terminal of the driver; wherein an output signal of the delay circuit is applied to gates of the second PMOS transistor and the NMOS transistor; and wherein an inverse signal of the input signal is applied to a gate of the first PMOS transistor.

A third embodiment of the present invention provide a pulse generator comprising: a pulse generating unit for generating an output signal with a uniform pulse width in response to an input signal; a first delay circuit for delaying the output signal of the pulse generating unit by a predetermined time; a NOR gate receiving the output signal of the pulse generating unit and an output signal of the delay circuit; a NAND gate receiving the output signals of the pulse generating unit and the delay circuit; a first inverter for inversing an output signal of the NOR gate; and a second inverter for inversing an output signal of the NAND gate; wherein the first and second inverters output first and second pulse signals, respectively.

In the third embodiment, the pulse generating unit comprises: a first driving unit turned on/off by an input signal; a latch for holding a first power supply voltage to be transferred through the first driving unit; an inverter for inversing an output signal of the latch; a second delay circuit for delaying an output signal of the inverter by a predetermined time; and a second driving unit turned on/off by an output signal of the second delay circuit; wherein the latch holds a second power supply voltage when the second driving unit is turned on, a pulse width of the output signal of the inverter is uniform regardless of a frequency of the input signal, the output signal of the inverter being an output signal of the pulse generating unit.

In the third embodiment, the pulse generating unit comprises: a first driving unit turned on/off by an inverse signal of an input signal; a latch for holding a first power supply voltage to be transferred through the first driving unit; an inverter for inversing an output signal of the latch; a second delay circuit for delaying an output signal of the inverter by a predetermined time; and a second driving unit turned on/off by an output signal of the second delay circuit; wherein the latch holds a second power supply voltage when the second driving unit is turned on, a pulse width of the output signal of the inverter is uniform regardless of a frequency of the input signal, the output signal of the inverter being an output signal of the pulse generating unit.

In the third embodiment, a pulse width of the first pulse signal is wider than a pulse width of the second pulse signal and the pulse width of the second pulse signal is adjusted by a predetermined time of the second delay circuit.

A fourth embodiment in accordance with the present invention provides a pulse generator controlled by a control signal, wherein a pulse signal to be used in a semiconductor device in pulse base is generated when a frequency of an external input signal applied to the semiconductor device is under a predetermined level; wherein the external input signal is directly used as an internal clock signal of the semiconductor device when a frequency of the external input signal is over the predetermined level; and wherein the control signal varies logically in accordance with a frequency range of the external input signal.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Reference will now be made in greater detail to a preferred embodiment of the invention, an example of which is illustrated in the accompanying drawings. Wherever possible, the same reference numerals will be used throughout the drawings and the description to refer to the same or like parts.

Figure 7:
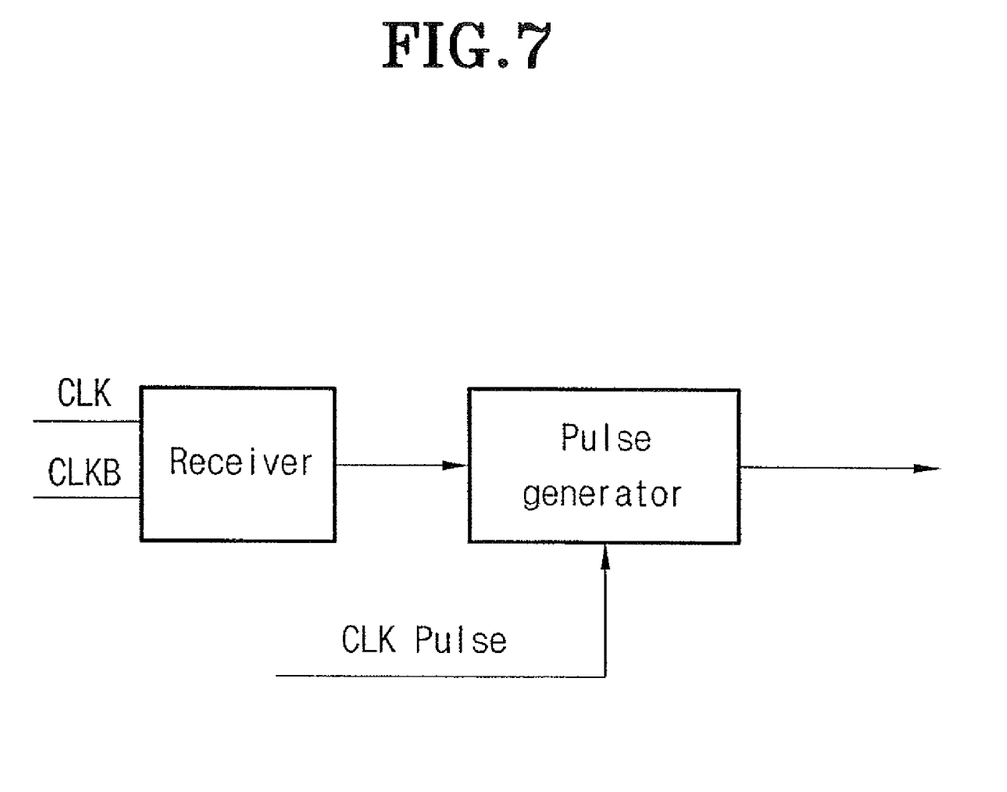
FIG. 7 is a block diagram of a pulse and clock circuit.

FIG. 7 is a block diagram of a pulse and clock base circuit.

Referring to FIG. 7, a receiver inputs external clock signals CLK and CLKB, and a pulse generator is controlled by a control signal CLK_pulse. The control signal CLK_pulse is a signal controlled by a mode register set of a memory device. The control signal CLK_pulse is enabled when the external clock signal CLK oscillates in a frequency about under 300 MHz, while disabled when the external clock signal CLK is a high frequency beyond 300 MHz.

In operation, when the external clock signal is a low frequency signal, an output signal from the receiver is applied to the pulse generator and the pulse generator outputs an internal clock signal. On the other hand, when the external clock signal is a high frequency signal, the output signal of the receiver is used as the internal clock signal directly. The reason why the external clock signal of high frequency is not operable with the pulse generator is because as described in the conventional case, it is difficult to obtain a stable internal pulse under the condition of high frequency.

As such, the present invention illustrated in FIG. 7 differentiates ways of generating an internal clock signal in accordance with the range of frequency of the external clock signal, in order to generate a stable internal pulse signal. But, there is still remained with considerable variation in a pulse width of the internal clock signal in accordance with a frequency of the external clock signal, as aforementioned in FIG. 3, even when the external clock signal is directly used as the internal clock signal.

Hereinafter, it will be described about a circuit for generating an internal clock signal with a stable pulse width regardless of variation in a frequency of the external clock signal.

Figure 8A:
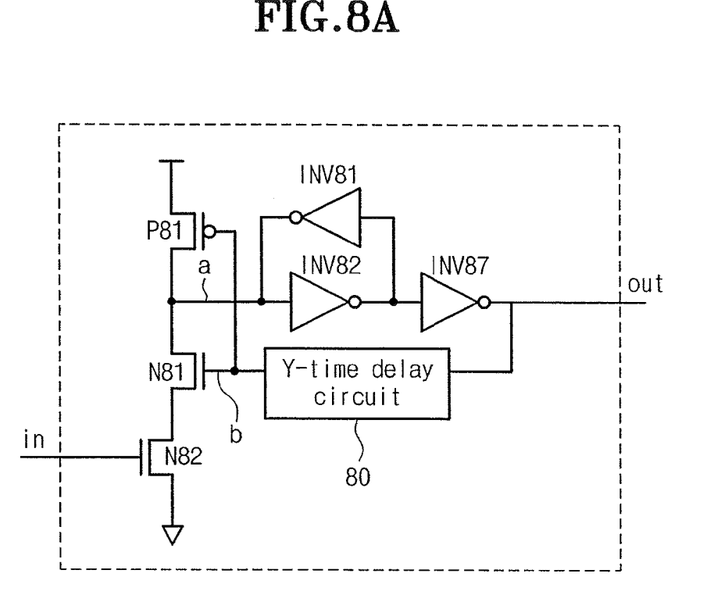
FIG. 8A illustrates an exemplary embodiment of a pulse generator in accordance with the present invention.

FIG. 8A illustrates an exemplary embodiment of the pulse generator in accordance with the present invention. As shown in FIG. 8A, the pulse generator according to the present invention is comprised of a PMOS transistor P81, an NMOS transistor N81 and an NMOS transistor N82 which are connected between a power supply voltage and a ground voltage in series, a latch, INV81 and INV82, and an inverter INV87 which are connected between an output terminal OUT and a node A as a drain the NMOS transistor N81, and a Y-time delay circuit 80 connected between the output terminal OUT and a node B that is a common gate of the PMOS and NMOS transistors P81 and N81. An input signal IN is applied to a gate of the NMOS transistor N82.

In FIG. 8A, the latch constructed of two inverters INV81 and INV82 inverses and latches a signal of the node A. An output signal of the latch is transferred to the output terminal OUT through the inverter INV87. The Y-time delay circuit 80 delays a signal of the output terminal OUT by a Y-time and then transfers the delayed signal to the node B. In reference, during a standby state before the input signal is applied thereto, the node B is set on high level.

In operation, if the input signal transits to high level, the input node A of the latch becomes low level. Thus, the latch outputs high level and the inverter INV87 outputs low level to the output terminal OUT in response to the high level signal from the latch. The Y-time delay circuit 80 delays the low level signal of the output terminal OUT by the Y-time and transfers the delayed signal to the node B. Therefore, as the NMOS transistor N81 is turned off and the PMOS transistor P81 is turned on, the node A transits to high level. Since the NMOS transistor N81 is turned off, it is possible to obtain the output signal OUT having a stable pulse width nevertheless of a pulse width (in other words, a high level period or high and low of a frequency) of the input signal IN.

Figure 8B:
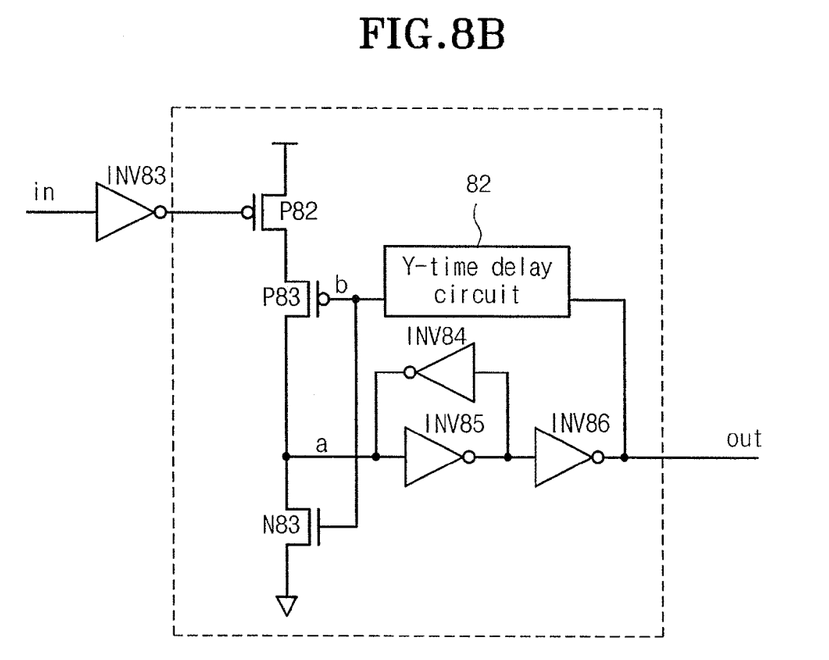
FIG. 8B illustrates another exemplary embodiment of a pulse generator in accordance with the present invention.

FIG. 8B illustrates another exemplary embodiment of a pulse generator in accordance with the present invention. In reference, the input signal IN in FIGS. 8A and 8B is the output signal OUT illustrated in FIG. 7, i.e., an internal clock signal.

The pulse generator of FIG. 8B is comprised of a PMOS transistor P82, a PMOS transistor P83 and an NMOS transistor P83 which are connected between a power supply voltage and a ground voltage in series, a latch INV84 and INV85 and an inverter INV86 which are connected between an output node OUT and a node A as a drain the NMOS transistor N83, and a Y-time delay circuit 82 connected between the output terminal OUT and a node B that is a common gate of the PMOS and NMOS transistors P83 and N83. An input signal IN is applied to a gate of the PMOS transistor P82 through the inverter INV83.

In FIG. 8B, the latch constructed of two inverters INV84 and INV85 inverses and latches a signal of the node A. An output signal of the latch is transferred to the inverter INV86. The Y-time delay circuit 82 delays a signal of the output terminal OUT by a Y-time and then transfers the delayed signal to the node B.

A circuital operation of FIG. 8B is similar to that of FIG. 8A, so it will be omitted.

Figure 8C:
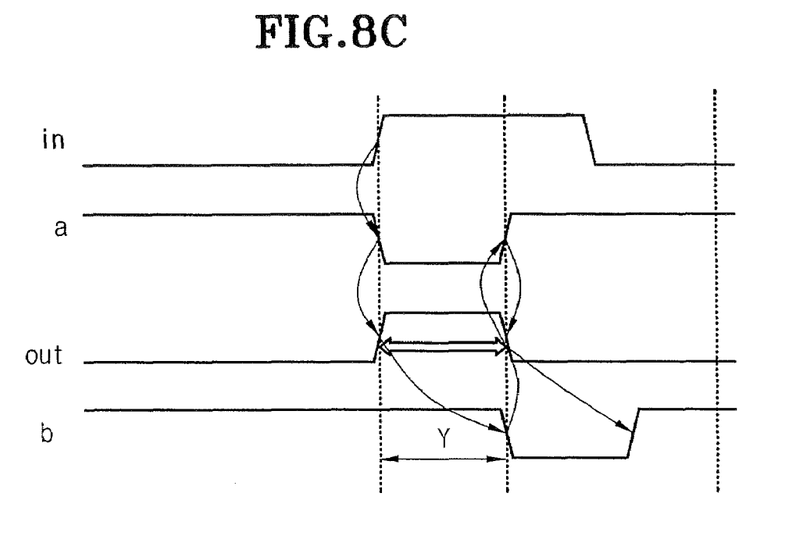
FIGS. 8C and 8D are signal timing diagrams illustrating operations of the pulse generators shown in FIGS. 8A and 8B.
Figure 8D:
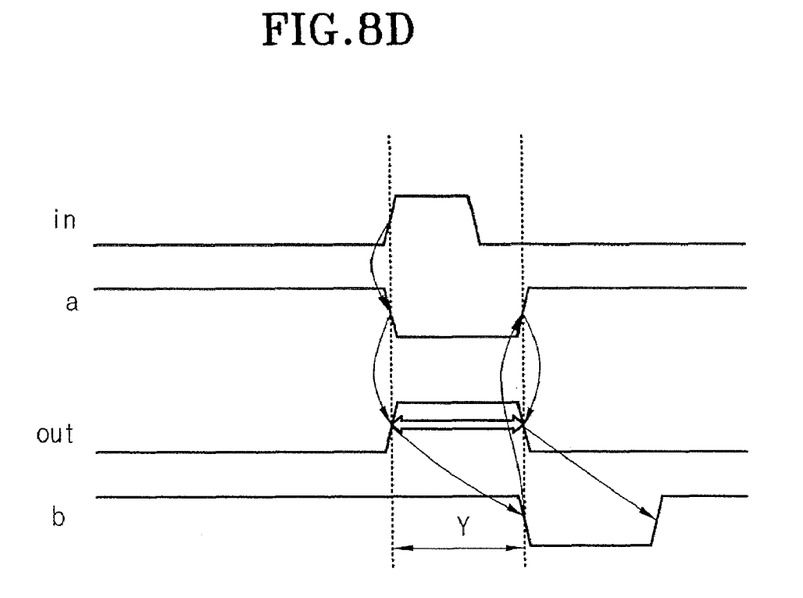

FIGS. 8C and 8D are signal timing diagrams illustrating operations of the pulse generators shown in FIGS. 8A and 8B.

FIG. 8C is the case with a low frequency of the input signal IN, while FIG. 8D is the case with a high frequency of the input signal IN.

As illustrated, it can be seen that a pulse width of the output signal OUT is regardless of a pulse width of the input signal IN. As a result, the circuit of the present invention is able to output a signal having a stable pulse width.

Figure 8E:
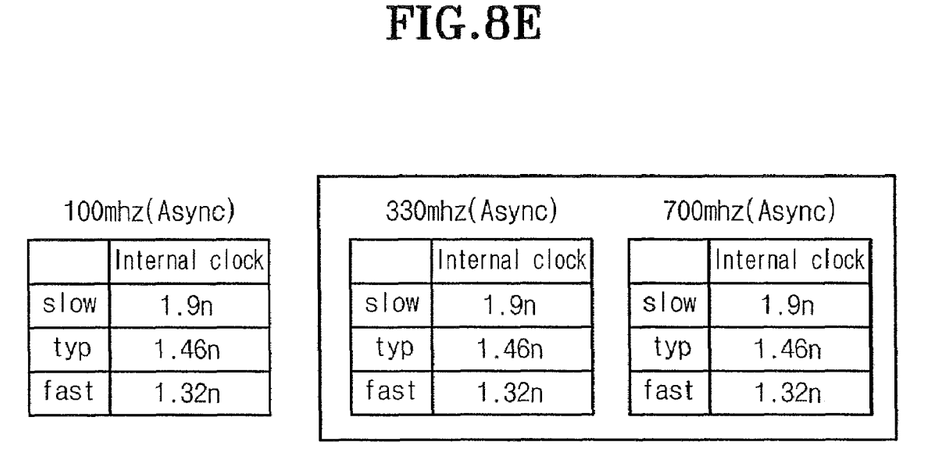
FIG. 8E shows a experimental result representing a high level period of an internal clock signal is regardless of a frequency of an input signal, while generating the internal clock signal from the generators of FIGS. 8A and 8B in accordance with frequency variation of the input signal.

FIG. 8E shows an experimental result representing a high level period of an internal clock signal is stable regardless of a frequency of the input signal, while generating the internal clock signal from the generators of FIGS. 8A and 8B in accordance with frequency variation of the input signal.

Figure 9A:
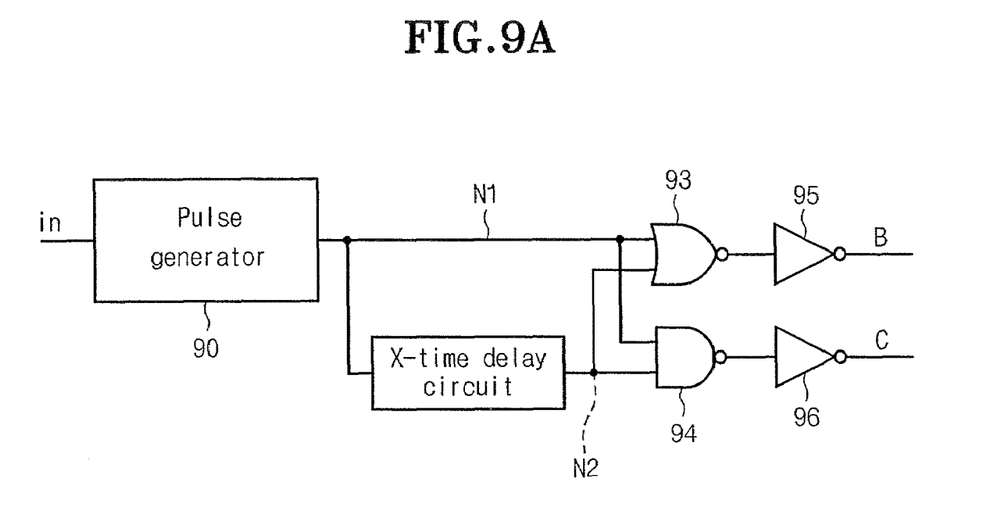
FIGS. 9A, 9B and 9C illustrate another case of a circuit for generating an internal clock signal using the pulse generators illustrated in FIGS. 8A through 8E.
Figure 9B:
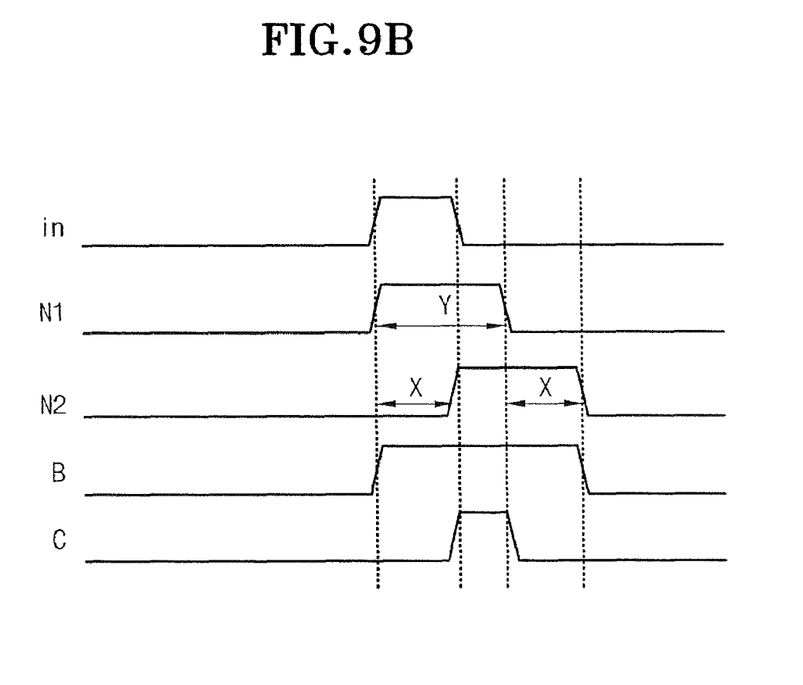
Figure 9C:
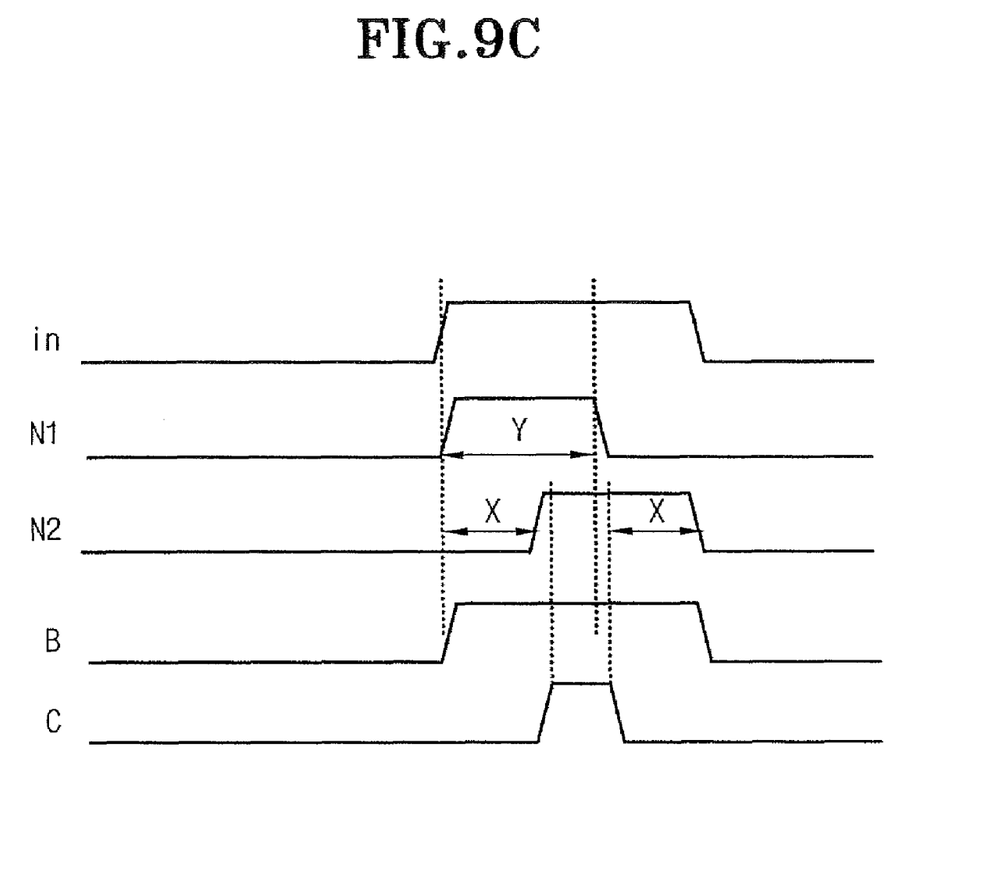

FIGS. 9A, 9B and 9C illustrate another case of a circuit for generating an internal clock signal using the pulse generators illustrated in FIGS. 8A through 8E.

The circuit of FIG. 9A is comprised of a pulse generator 90, an X-time delay circuit 92 for delaying an output signal of the pulse generator 90 by an X-time, a NOR gate 93 receiving output signals from the pulse generator 90 and the X-time delay circuit 92, a NAND gate 94 receiving output signals from the pulse generator 90 and the X-time delay circuit 92, an inverter 95 for outputting a signal inverse to an output signal of the NOR gate 93, and an inverter 96 for outputting a signal inverse to an output signal of the NAND gate 94.

The pulse generator shown in FIG. 9A is identical to those of FIGS. 8A and 8B. Therefore, the input and output signals, IN and OUT, in the pulse generator 90 are identical to those shown in FIGS. 8A and 8B. The output signals of the inverters 95 and 96 are denoted to B and C, respectively.

Signal timings of the circuit shown in FIG. 9A are illustrated in FIGS. 9B and 9C.

FIG. 9B represents the case with a high frequency of the input signal IN applied to the pulse generator 90, while FIG. 9C represents the case with a low frequency of the input signal IN applied to the pulse generator 90.

In FIGS. 9B and 9C, a node N1 corresponds to the output signal OUT of the pulse generator 90, while a node N2 is assigned to the output signal of the X-time delay circuit 92.

As illustrated in FIGS. 9B and 9C, as an active period (i.e., a high level period) of the output signal OUT from the pulse generator 90 is not involved in a pulse width of the input signal, a signal waveform of the node N1 is equal to that of the output signal OUT. Thus, waveforms of the output signals B and C are identical from each other regardless of a frequency of the input signal IN applied to the pulse generator 90.

The circuit of FIG. 9A may be used to generate other internal pulse signals employed in a semiconductor device. Especially, it is possible to obtain an output signal C having a margin of the X-time by adjusting the delay time of the X-time delay circuit 92.

As aforementioned, the present invention shows a technique for generating a stable internal clock signal in spite of variations of processing parameters (processing conditions, voltages, temperature, and so on).

In FIG. 7, a pulse generator is available as before when a frequency of an external clock signal is low, while the external clock signal is directly usable as an internal clock signal when a frequency of the external clock signal is high.

Moreover, the present invention provides pulse generators, as shown in FIGS. 8A and 8B, which generates an output signal having a uniform pulse width, as desirable by a designer, regardless of a frequency of an input signal. Therefore, it comes to be possible to select an active period optionally without regarding a frequency of a signal applied to a semiconductor device. As a result, the pulse generator of the present invention is able to generate an internal clock signal necessary to internal operations of a semiconductor device in a stable condition.

In addition, the present invention provides another pulse generator as illustrated in FIG. 9A, using the pulse generators of FIGS. 8A and 8B, which generates an internal pulse signal having an X-time margin. The circuit of FIG. 9A may be variously applicable to the cases of generating additionally internal pulse signals in a semiconductor device.

As apparent from the above description, the circuit of the present invention is able to generate a stable internal signal desired by a designer nevertheless of variation in a frequency of an external signal, as well as generating various internal signals necessary to internal operations of a semiconductor device. Consequently, the present invention offers a stabilized internal operation in a semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

I claim:

1. A pulse generator controlled by a control signal, wherein a pulse signal to be used in a semiconductor device is generated by the pulse generator when a frequency of an external input signal applied to the semiconductor device is less than a predetermined frequency, the pulse generator comprising:

a first driving unit having first and second inputs, an output, and being turned on and off by said external input signal, which is input to said first input of first driving unit;

a latch having an input and an output, said latch input being coupled to the first driving unit output and which latches a first power supply voltage from the first driving unit;

a delay circuit having an input coupled to the latch output and an output coupled directly to said second input of the first driving unit, said delay circuit receiving a positive-going signal at its input and delaying the output of said positive-going signal to said second input of said first driving unit by a predetermined time; and a second driving unit having an input directly coupled directly to the delay circuit output and having an output coupled to the input of the latch and being turned on and off by an output signal of the delay circuit;

wherein the external input signal input to said first input of first driving unit is directly used as an internal clock signal of the semiconductor device when the frequency of the external input signal is over the predetermined level; and wherein the control signal varies logically in accordance with a frequency range of the external input signal.

2. A pulse generator controlled by a control signal, wherein a pulse signal to be used in a semiconductor device is generated by the pulse generator when a frequency of an external input signal applied to the semiconductor device is less than a predetermined frequency, the pulse generator comprising:

a first driving unit having an output and a first input that receives the external input signal to be applied to the semiconductor device and further having a second input and being turned on/off by the external input signal;

a latch having an input coupled to said first driving unit output, said latch further having an output, said latch latching a first power supply voltage from the first driving unit;

a delay circuit having an input connected to the output of the latch and an output directly connected to the second input of the first driving unit, said delay circuit receiving a positive-going input signal and producing a positive going output signal at its output that is delayed by a predetermined time; and a second driving unit having an input directly coupled to the output of the delay circuit and an output coupled to the input of said latch and which is turned on and off by an output signal of the delay circuit;

wherein the external input signal is directly used as an internal clock signal of the semiconductor device when a frequency of the external input signal is over the predetermined frequency; and wherein the control signal varies logically in accordance with a frequency range of the external input signal.

\* \* \* \* \*